United States Patent [19]

Carpenter et al.

[11] Patent Number: 4,614,836
[45] Date of Patent: Sep. 30, 1986

[54] GROUND CONNECTOR FOR MICROELECTRONIC CIRCUIT CASE

[75] Inventors: Charles L. Carpenter, Irvine; Jerry L. Carter, Pomona; Terry D. McElwee, Chino, all of Calif.

[73] Assignee: Axia Incorporated, Anaheim, Calif.

[21] Appl. No.: 591,106

[22] Filed: Mar. 19, 1984

[51] Int. Cl.[4] ............................................. H05K 5/04
[52] U.S. Cl. ...................................... 174/51; 29/879; 174/52 FP; 357/74
[58] Field of Search ................ 174/52 FP, 52 H, 51, 174/50, 52, 50.6, 50.61, 50.63; 339/14 R; 361/399, 302; 357/65, 74; 29/879, 884; 228/122, 189

[56] References Cited

U.S. PATENT DOCUMENTS

| | | | |
|---|---|---|---|
| 3,381,080 | 4/1968 | Stelmak | 174/52 FP |
| 3,548,076 | 12/1970 | Cooke et al. | 174/52 FP |
| 4,072,816 | 2/1978 | Gedney et al. | 174/52 FP |
| 4,097,915 | 6/1978 | Locke | 361/433 |
| 4,190,735 | 2/1980 | Checki, Jr. | 174/52 FP |
| 4,266,090 | 5/1981 | Scherer | 174/52 FP |
| 4,453,033 | 6/1984 | Duff et al. | 174/52 FP |

Primary Examiner—Arthur T. Grimley
Assistant Examiner—D. A. Tone
Attorney, Agent, or Firm—Harris, Kern, Wallen & Tinsley

[57] ABSTRACT

A connector or clip for grounding one or more electrical conducting leads in a microelectronic circuit case. A connector in the form of a metal plate attached to a wall of a case and to an insulated lead projecting through the wall, providing an electrical conducting path between the lead and the case. A connector plate with a flat face and a slot therein, and in one embodiment with an outwardly projecting tab at the bottom of the slot, with the connector being suitable for attachment by low temperature and high temperature brazing and spot welding.

8 Claims, 7 Drawing Figures

U.S. Patent Sep. 30, 1986 4,614,836
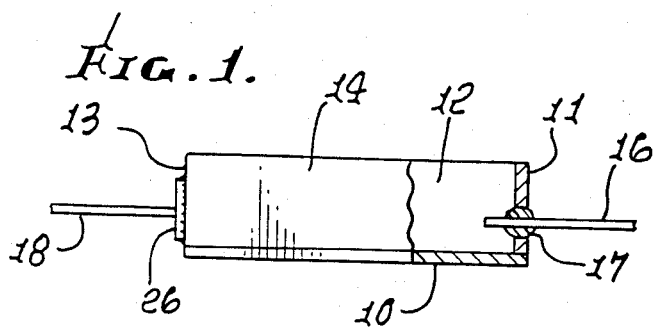
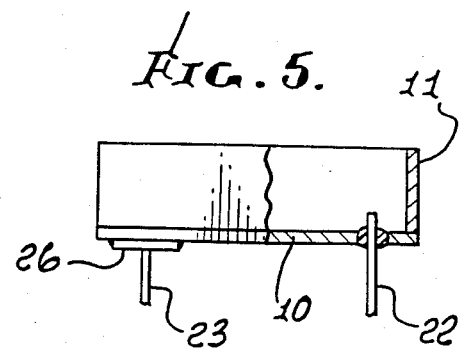
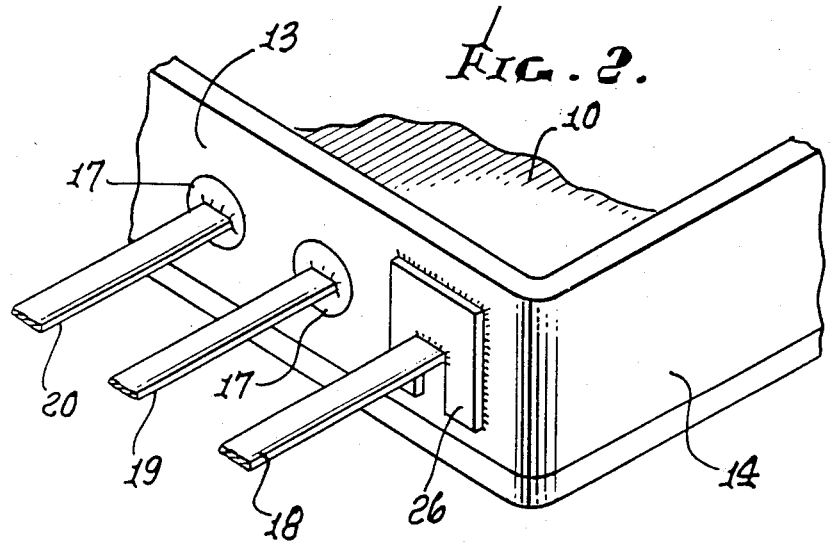
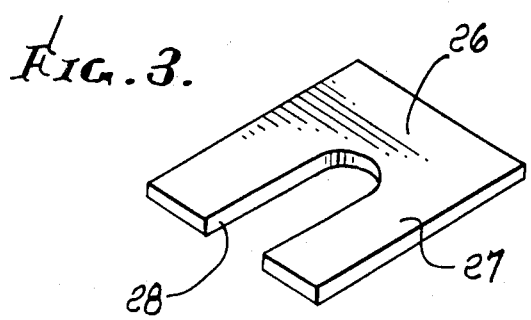
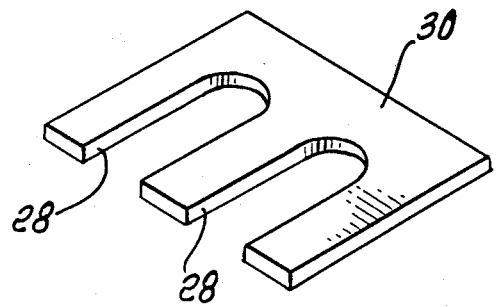
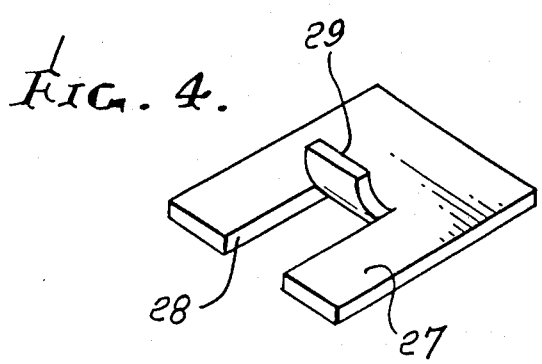
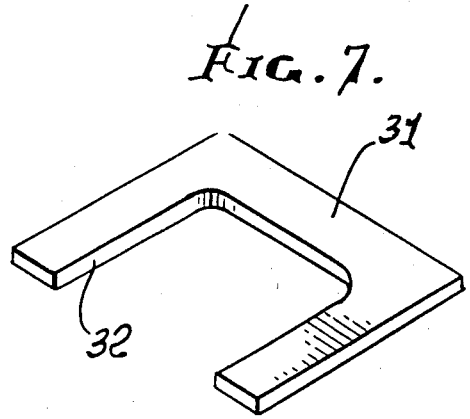

GROUND CONNECTOR FOR MICROELECTRONIC CIRCUIT CASE

BACKGROUND OF THE INVENTION

This invention relates to microelectronic circuit cases, and in particular to a new and improved ground connection.

Microelectronic components such as chips, substrates and other devices are packaged in a variety of configurations. One widely used technique is to mount the circuit component in a metal case with a plurality of feedthrough conductors in the form of terminals or leads individually positioned in insulators in a wall of the case. A lid is attached to the case to provide a hermetic enclosure. The cases come in a variety of sizes, typically ranging from about 0.4 to 0.4 inches to about 2 by 4 inches, with thecase interior in the order of ⅛ inch deep.

The standard case is a metal container, being drawn from a single piece of metal or being assembled with a bottom and four sides. The circuit component or components are mounted in the case with electrical connections to appropriate leads, and the lid is attached. A typical metal case and method for seam welding a lid thereto are shown in U.S. Pat. No. 4,015,071.

Often it is desired to have one or more of the leads of a case electrically grounded. In the past, this has been accomplished by utilizing a metal for sealing the lead in the case, rather than an insulator. This provides a satisfactory ground connection, but has a serious disadvantage in that the specific lead to be grounded has to be decided prior to the manufacture of the case.

It is an object of the present invention to provide a new and improved microelectronic circuit case which may be conventional in construction and which may be modified after completion of the case for grounding of any one or more of the leads. A further object is to provide such a grounding connection by means of a flat plate or clip which can be attached to an outer wall of the case and to a selected lead, by conventional spot welding, brazing or the like.

Further objects, advantages, features and results will more fully appear in the course of the following description.

SUMMARY OF THE INVENTION

A microelectric circuit case including a container with a bottom wall and upstanding side walls defining an open top, one or more electrical insulators mounted in at least one of the walls, one or more electrical conducting leads positioned in respective insulators, and an electrical conducting plate attached to the wall and a lead providing an electrical connection between the lead and container. A ground clip in the form of a plate with a flat face and a slot therein for positioning said face against the wall of a case with a lead in the slot. A ground clip with an outwardly projecting tab at the bottom of the slot for overlying a lead when the clip is placed in position at a case wall.

BRIEF DESCRIPTION OF THE DRAWING

FIG. 1 is a side view, partly in section, of a microelectronic circuit case incorporating the presently preferred embodiment of the invention;

FIG. 2 is an enlarged partial perspective view of the case of FIG. 1;

FIG. 3 is a perspective view of the ground clip utilized in the assembly of FIG. 2;

FIG. 4 is a view similar to FIG. 3 showing an alternative embodiment of the clip;

FIG. 5 is a view similar to that of FIG. 1 showing leads in the bottom wall of the case; and FIGS. 6 and 7 are views similar to that of FIG. 3 showing alternative configurations for the ground clip for use with more than one lead.

DESCRIPTION OF THE PREFERRED EMBODIMENTS

FIGS. 1 and 2 show a container for a microelectronic circuit case having a bottom wall 10 and side walls 11, 12, 13 and 14. FIG. 1 shows an electrical conducting lead 16 mounted in the wall 11 in an electrical insulator 17, and a similar lead 18 mounted in the wall 13. Typically, a plurality of such leads is mounted in each of two opposing walls, and three such leads 18, 19, 20 are shown in FIG. 2. An alternative configuration for lead mounting is shown in FIG. 5, with leads 22 and 23 in the bottom wall 10. Typically the case will include two rows of leads, with lead 22 in one row and lead 23 in another row.

A ground connector 26 is mounted on the wall 13 in engagement with the lead 18. The ground connector 26 is made of an electrical conducting material and is welded or brazed or otherwise joined to the case wall and to the lead, provided an electrical connection between the lead 18 and the case.

The ground connector 26 is shown in greater detail in FIG. 3 and comprises a metal plate 27 with a slot 28 therein. While a U-shaped ground connector is preferred, an L-shaped plate or an I-shaped plate could be used if desired.

An alternative configuration for the ground connector is shown in FIG. 4, comprising a plate 27 with a slot 28 and an outwardly turned tab 29 at the bottom of the slot.

The ground connector of FIG. 3 is readily attached to the case and to the lead by low temperature or high temperature brazing and other conventional forms of joining metals. The ground connector of FIG. 4 with the tab 29 can also be attached by spot welding, with the tab 29 overlying the lead.

Normally it is only desired to provide a ground connection with one lead of a case. However where more than one lead is to be grounded, a plurality of the ground connector clips can be used. Where the leads to be grounded are adjacent one another, a ground connector clip 30 as shown in FIG. 6 may be used, with two slots 28. In an alternative configuration, the ground connector clip 31 of FIG. 7 with a larger slot 32. This configuration is suitable for grounding adjacent leads, and also for grounding two leads with an ungrounded lead therebetween.

The ground connector of the present invention does not need to be applied at the time of case manufacture, thereby permitting standard design cases to be produced, with selected leads grounded at a latter time. The ground connector can be applied after firing of the insulators and can be applied after plating of the case.

We claim:

1. A microelectronic circuit case including in combination:

a container with a bottom wall and upstanding side wall defining an open top;

an electrical insulator mounted in one of said walls;

an electrical conducting lead positioned in said insulator; and an electrical conducting plate attached to said lead and a wall providing an electrical conducting path between said lead and container;

with said plate having a flat face and a slot therein with said slot having an open end, with said face positioned against said wall and with said lead in said slot.

2. A case as defined in claim 1 wherein said plate has an outwardly projecting tab at the bottom of said slot, with said lead in said slot engaging said tab.

3. A case as defined in claim 1 wherein said insulator and lead are in a side wall of said container.

4. A case as defined in claim 1 wherein said insulator and lead are in the bottom wall of said container.

5. A case as defined in claim 1 wherein said plate is bonded to said wall about the periphery of said plate and is bonded to said lead at the closed end of said slot.

6. A microelectronic circuit case including in combination:

a container with a bottom wall and upstanding side walls defining an open top;

a plurality of electrical insulators mounted in at least one of said walls;

an electrical conducting lead positioned in each of said insulators; and an electrical conducting plate attached to one of said leads and a wall providing an electrical conducting path between said one lead and container;

with said plate having a flat face and a slot therein with said slot having an open end, with said face positioned against said wall and with said lead in said slot.

7. A method of grounding an insulated lead of a microelectronic circuit case to said case, including the steps of:

positioning the face of an electrical conducting plate against the wall of said case by sliding the open end of a slot in said plate over said lead; and electrically bonding said plate to said case wall and to said lead.

8. The method as defined in claims 7 including bonding said plate to said wall about the periphery of said plate and bonding said plate to said lead at the closed end of said slot.

* * * * *